US008751147B2

(12) United States Patent
Colwell

(10) Patent No.: US 8,751,147 B2
(45) Date of Patent: Jun. 10, 2014

(54) SENSOR SYSTEM AND METHOD FOR USE WITH AN AUTOMATED GUIDED VEHICLE (AGV)

(75) Inventor: Dean Colwell, Lenox Township, MI (US)

(73) Assignee: Fori Automation, Inc., Shelby Township, MI (US)

(*) Notice: Subject to any disclaimer, the term of this patent is extended or adjusted under 35 U.S.C. 154(b) by 0 days.

(21) Appl. No.: 13/196,354

(22) Filed: Aug. 2, 2011

(65) Prior Publication Data

US 2012/0197477 A1    Aug. 2, 2012

Related U.S. Application Data

(60) Provisional application No. 61/370,145, filed on Aug. 3, 2010.

(51) Int. Cl.
*G01B 7/14* (2006.01)

(52) U.S. Cl.
USPC ............. 701/408; 701/26; 701/25; 701/30.9; 701/434; 701/525; 700/245; 700/253; 700/258

(58) Field of Classification Search
None
See application file for complete search history.

(56) References Cited

U.S. PATENT DOCUMENTS

| | | | | |
|---|---|---|---|---|
| 3,461,454 A | * | 8/1969 | Steckenrider | 342/452 |
| 3,612,206 A | * | 10/1971 | Ohntrup | 180/168 |
| 3,628,624 A | * | 12/1971 | Wesener | 180/168 |
| 3,768,586 A | * | 10/1973 | Thompson et al. | 180/168 |
| 3,933,099 A | * | 1/1976 | Sieb | 104/88.04 |
| 4,088,939 A | * | 5/1978 | Mitschke et al. | 318/576 |
| 4,253,541 A | * | 3/1981 | Iida et al. | 180/168 |
| 4,307,329 A | * | 12/1981 | Taylor | 318/587 |
| 4,465,155 A | * | 8/1984 | Collins | 180/169 |
| 4,530,056 A | * | 7/1985 | MacKinnon et al. | 701/25 |
| 4,593,238 A | | 6/1986 | Yamamoto | |
| 4,593,239 A | | 6/1986 | Yamamoto | |

(Continued)

FOREIGN PATENT DOCUMENTS

| | | |
|---|---|---|
| JP | 11321634 | 11/1999 |
| KR | 1020010045317 | 6/2001 |

OTHER PUBLICATIONS

Kanesan Muthusamy, "Statics Tutorial 3—Unit 2: Resultants and Centre of Gravity," Jan. 2005, Open University Malaysia, slide 10.*

(Continued)

*Primary Examiner* — Thomas Tarcza
*Assistant Examiner* — Richard Goldman
(74) *Attorney, Agent, or Firm* — Reising Ethington P.C.

(57) ABSTRACT

A sensor system for use with an automated guided vehicle (AGV) includes a plurality of sensor units electronically coupled to a sensor control module via parallel communications. Each sensor unit may include a sensor array having a plurality of sensor elements, a conditioning circuit having one or more filter/amplifiers, and a conversion circuit. The sensor control module may be configured to communicate with other AGV components via serial communications. The sensor system is capable of obtaining and storing sensor readings with or without associated offset values and can use the sensor readings to determine the center of a magnetic field using methods that require relatively little processing power. A method of calibrating the sensor system may include determining and storing offset values for a plurality of sensor elements and may be performed with the sensor system installed or uninstalled to the AGV.

18 Claims, 9 Drawing Sheets

(56) References Cited

U.S. PATENT DOCUMENTS

| | | | |
|---|---|---|---|
| 4,656,406 A | 4/1987 | Houskamp | |
| 4,716,530 A * | 12/1987 | Ogawa et al. | 701/23 |
| 4,780,817 A * | 10/1988 | Lofgren | 701/23 |
| 4,817,750 A * | 4/1989 | Ishida et al. | 180/168 |
| 4,847,773 A * | 7/1989 | van Helsdingen et al. | 701/25 |
| 4,847,774 A * | 7/1989 | Tomikawa et al. | 701/23 |
| 4,866,617 A * | 9/1989 | Matsuda et al. | 701/25 |
| 4,885,536 A * | 12/1989 | Blanpain et al. | 324/207.13 |
| 5,029,294 A | 7/1991 | Kim | |
| 5,189,612 A * | 2/1993 | Lemercier et al. | 701/23 |
| 5,216,605 A * | 6/1993 | Yardley et al. | 701/23 |
| 5,404,087 A * | 4/1995 | Sherman | 318/587 |
| 5,434,781 A * | 7/1995 | Alofs et al. | 701/23 |
| 5,488,277 A * | 1/1996 | Nishikawa et al. | 318/587 |
| 5,525,884 A | 6/1996 | Sugiura et al. | |
| 5,539,646 A | 7/1996 | Peterson | |
| 5,672,947 A * | 9/1997 | Hisada et al. | 318/587 |
| 5,764,014 A * | 6/1998 | Jakeway et al. | 318/587 |
| 5,925,080 A * | 7/1999 | Shimbara et al. | 701/23 |
| 6,272,405 B1 * | 8/2001 | Kubota | 701/23 |
| 6,272,406 B2 * | 8/2001 | Alofs et al. | 701/24 |
| 6,345,217 B1 | 2/2002 | Zeitler et al. | |
| 6,429,016 B1 * | 8/2002 | McNeil | 436/47 |
| 6,459,966 B2 * | 10/2002 | Nakano et al. | 701/23 |
| 6,721,638 B2 | 4/2004 | Zeitler | |
| 6,971,464 B2 * | 12/2005 | Marino et al. | 180/167 |
| 7,206,677 B2 * | 4/2007 | Hulden | 701/23 |
| 7,873,437 B2 * | 1/2011 | Aldred et al. | 700/253 |
| 7,991,521 B2 * | 8/2011 | Stewart | 701/23 |
| 2006/0161318 A1 * | 7/2006 | Aldred et al. | 701/23 |
| 2008/0215202 A1 * | 9/2008 | Breed | 701/25 |
| 2011/0046780 A1 * | 2/2011 | Anderson | 700/248 |
| 2011/0301800 A1 * | 12/2011 | Furuno et al. | 701/25 |
| 2012/0029755 A1 * | 2/2012 | Johnson | 701/26 |
| 2012/0083961 A1 * | 4/2012 | Sato et al. | 701/25 |
| 2012/0083962 A1 * | 4/2012 | Sato et al. | 701/25 |
| 2012/0083963 A1 * | 4/2012 | Sato et al. | 701/25 |
| 2012/0143429 A1 * | 6/2012 | Anderson | 701/25 |
| 2012/0179321 A1 * | 7/2012 | Biber et al. | 701/25 |

OTHER PUBLICATIONS

International Search Report for PCT/US2011/046284 dated Dec. 27, 2011, 3 pages.

* cited by examiner

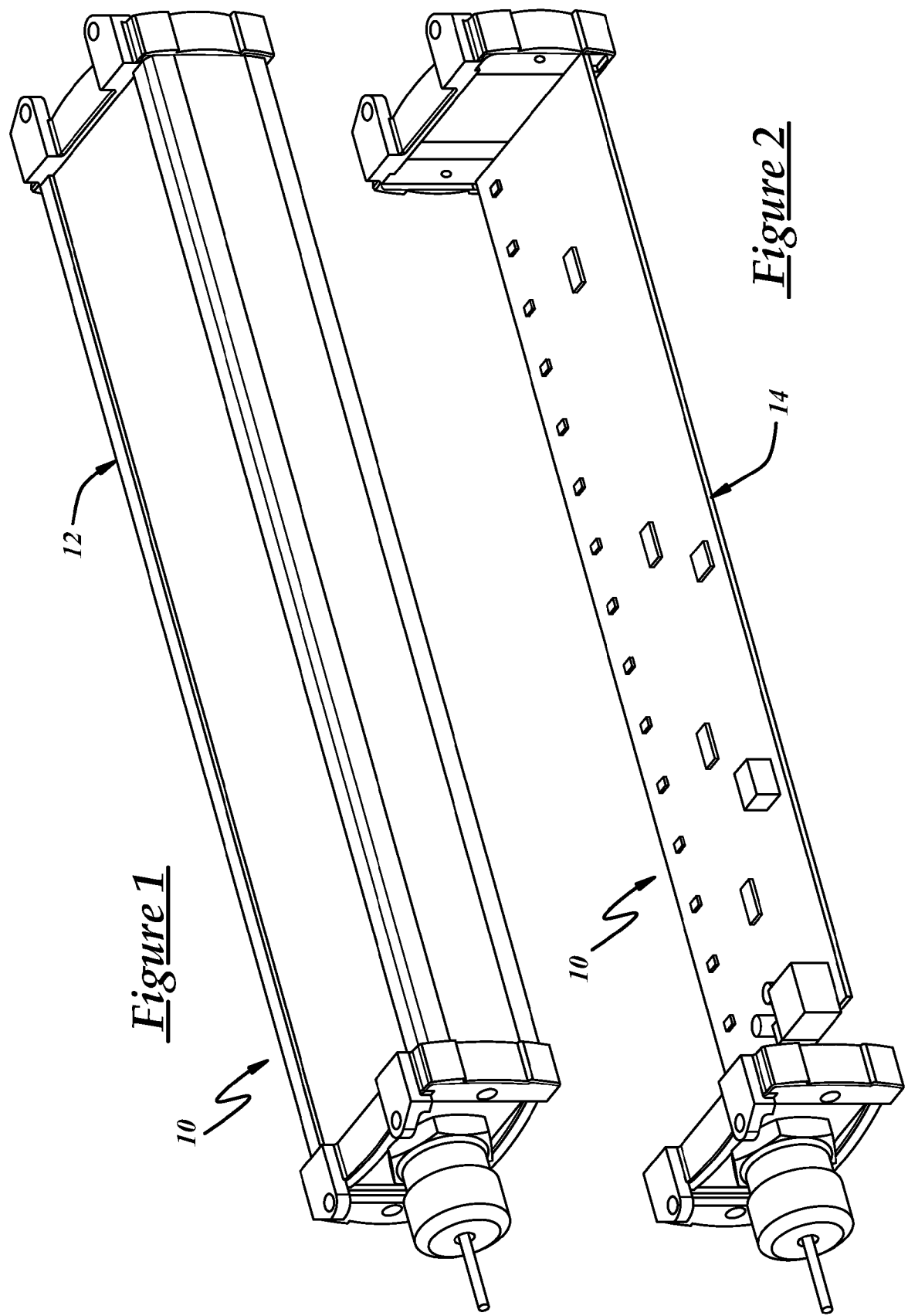

US 8,751,147 B2

SENSOR SYSTEM AND METHOD FOR USE WITH AN AUTOMATED GUIDED VEHICLE (AGV)

CROSS-REFERENCE TO RELATED APPLICATION

This application claims the priority of U.S. Provisional Application No. 61/370,145, filed Aug. 3, 2010, the entire contents of which are hereby incorporated by reference.

TECHNICAL FIELD

The present disclosure generally relates to sensor systems and methods of using the same and, more particularly, to sensor systems and methods that provide information relating to the location, position, orientation, heading, etc. of automated guided vehicles (AGVs).

BACKGROUND

Automated guided vehicles may be used to transport payloads along a predetermined route without real-time human assistance. For example, an AGV can transport items such as heavy vehicle components like engines, chassis, etc. along a route along a manufacturing plant floor to deliver the payload from one location to another or to allow various manufacturing operations to be performed thereon. AGVs may offer the ability to carry payloads too heavy for a person to carry and without the supervision of a person, while also offering the flexibility to be reconfigured to follow a different route or carry different types of payloads. Some AGVs include drive and/or steering mechanisms that can propel, guide, and/or steer the vehicle along the predetermined route.

SUMMARY

According to one embodiment, a sensor system is provided for use with an automated guided vehicle (AGV). The sensor system includes a sensor housing that is attached to the AGV and a sensor board that is at least partially located within the sensor housing. The sensor board includes a plurality of sensor units electronically coupled to a sensor control module. Each of the sensor units interacts with an indicating system that follows a pre-determined path along the ground. Each of the sensor units includes a sensor array having a plurality of sensor elements that take sensor readings regarding the position of the AGV with respect to the indicating system. Each sensor unit further includes a conditioning circuit that is electronically coupled to the sensor array. The conditioning circuit includes a plurality of filter/amplifiers that process the sensor readings from the sensor array. Each of the sensor units also includes a conversion circuit that is electronically coupled to the conditioning circuit. The conversion circuit converts the sensor readings from the conditioning circuit for transmission to the sensor control module.

According to another embodiment, a method is provided for operating a sensor system for an automated guide vehicle (AGV). The method includes the steps of: (a) providing a sensor system having a plurality of magnetic sensor elements that interact with a magnetic indicating system that is laid out on the ground and follows a pre-determined path; (b) obtaining sensor readings from the magnetic sensor elements; (c) storing the sensor readings from the magnetic sensor elements at a memory device; and (d) using the stored sensor readings to determine a center of field value that represents the center or centroid of a corresponding magnetic field produced by the magnetic indicating system.

According to another embodiment, a method is provided for calibrating a sensor system for an automated guided vehicle (AGV). The method includes the steps of: (a) initializing a sensor system having a plurality of sensor elements; (b) obtaining and averaging a plurality of sensor readings for each of the sensor elements; (c) using the averaged sensor readings for each of the sensor elements to generate a corresponding offset value for each of the sensor elements; and (d) electronically storing the offset values for each of the sensor elements in the sensor system.

BRIEF DESCRIPTION OF THE DRAWINGS

Preferred exemplary embodiments of the invention will hereinafter be described in conjunction with the appended drawings, wherein like designations denote like elements, and wherein:

FIG. 1 is a perspective view of an exemplary sensor system that may be used with an AGV;

FIG. 2 is a perspective view of the exemplary sensor system of FIG. 1, where a sensor housing has been removed to reveal a sensor board;

DETAILED DESCRIPTION OF THE PREFERRED EMBODIMENTS

Figure 3:
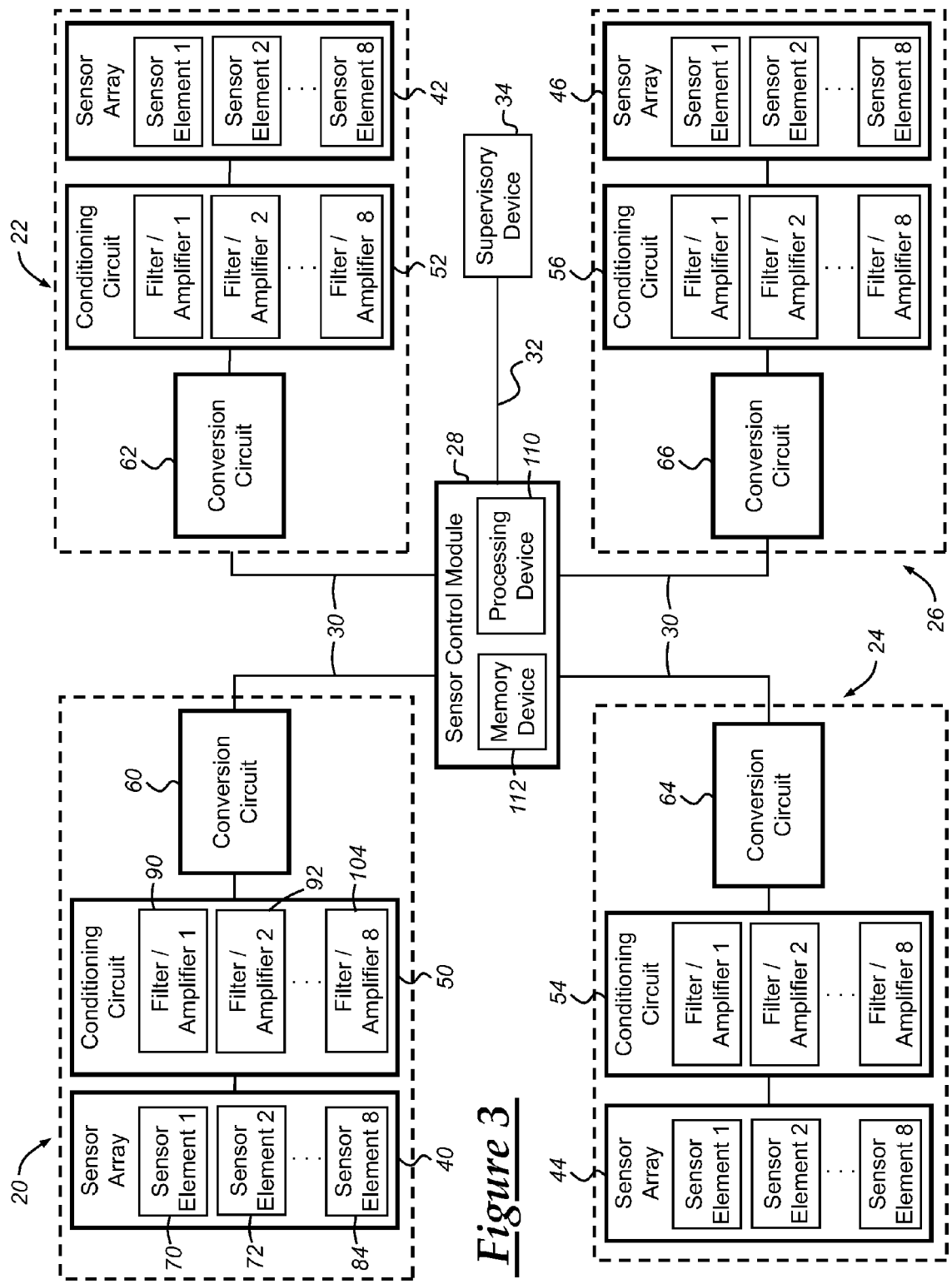
FIG. 3 is a schematic block diagram of the exemplary sensor board of FIG. 2.

The exemplary sensor system and method described herein may provide information relating to the location, position, orientation, heading, etc. of an automated guided vehicle (AGV). An AGV is typically an unmanned and self-propelled vehicle that travels around a guided path or route laid out on the floor of a factory, warehouse, distribution center, graded earth, etc. Some examples of potential AGV applications include handling materials, delivering parts in a warehouse, advancing a work piece or assembly through various stages of a manufacturing process, and moving a piece of industrial equipment (e.g., a drilling or welding device) around a large stationary work piece, to name a few. Skilled artisans will appreciate that there are a number of different types of AGVs used across a variety of industries, including the automotive, aerospace, warehousing, and distribution center industries. The exemplary system and method described below are not limited to any particular type or application of an AGV, and may be used with any AGV known in the art.

Sensor System

With reference to FIGS. 1 and 2, there is shown an exemplary embodiment of a sensor system 10 that may be used with an AGV and includes a sensor housing 12 and a sensor board 14. Sensor system 10 may be mounted to the underside of an AGV so that it can interact with an indicating system located along the ground. As used herein, an indicating system broadly includes an arrangement of any type of detectable markers, beacons, or guides that can be located along the ground to form a path for the AGV to move along. The indicating system may include active elements, such as RF-transmitting devices, electromagnetic devices, or other powered devices that produce a magnetic field or emit electromagnetic radiation, and it may include passive elements, such as permanent magnets, reflectors, colored tape, etc. Indicating system elements may be provided as strips or wires or other continuous elements, or they may be separate or discrete elements that are arranged along the ground in a pattern such as a path, grid, or array. For example, a magnetic sensor system 10 may be used with an AGV to detect and/or evaluate an indicating system that includes magnetic or electromagnetic elements such as a thin permanent magnetic strip installed on top of or just beneath the ground, or it may be similarly used with an indicating system that includes a plurality of magnets or electromagnetic installed in the ground in a particular arrangement in the area in which the AGV is to operate.

According to the exemplary embodiment shown in FIGS. 1 and 2, sensor system 10 is an elongated device that, when mounted to the underside of an AGV, extends across at least a portion of the lateral width of the AGV so that it is generally perpendicular to the magnetic strip or other indicating system on the ground. Sensor system 10 may be centered or off-centered on the underside of the AGV, it may be located near the front, middle or rear of the AGV, it may extend across the entire lateral width of the AGV or only a portion of it, and it may be by itself or used in conjunction with other sensor systems, to name a few possibilities. While the particular embodiments of sensor system 10 described below are described so that they work with indicating systems that produce magnetic fields, it should be appreciated that sensor system 10 may be configured to work with indicating systems of any type described above.

Sensor housing 12 is a housing or cover that may be used to protect or shield some of the components of sensor system 10. In this particular embodiment, sensor housing 12 is an elongated housing that surrounds and protects sensor board 14 and is made of a material, like an aluminum-based material, with desirable electromagnetic interference (EMI) characteristics that enable proper interaction with a magnetic strip on the ground yet avoid interfering with other operations of the AGV. Sensor housing 12 may include one or more spring-loaded hinges or connections that enable the sensor housing to be pivotally attached to the underside of the AGV. If the AGV runs over debris or other objects, the hinges will allow the sensor housing to pivot out of the way or pivotally break-away from the underside of the AGV instead of allowing damage to sensor system 10. This pivotal breakaway mounting feature is optional, however, as sensor housing 12 may be fixedly mounted to the AGV instead.

Sensor board 14 is a circuit board to which a number of the components of sensor system 10 may be attached and may be at least partially located within sensor housing 12. According to one exemplary embodiment, sensor board 14 is a thin elongated circuit board that has a number of individual sensors aligned along one edge and snap-in connectors located at one or both ends so that multiple sensor boards can be connected end-to-end. This end-to-end connectivity makes sensor system 10 somewhat scalable, where additional sensor boards 14 can simply be added or removed in order to adjust the overall sweep or length of the sensing area and can be distinguished through the use of dipswitches. For example, if each sensor board 14 is approximately 12" long and up to eight sensor boards can be connected together, sensor system 10 may have an overall sensing area that is up to 96" across. Of course, this feature is optional, as sensor board 14 does not have to allow for end-to-end connections. In the exemplary embodiment shown in FIGS. 3-4, sensor board 14 includes sensor units 20-26, a sensor control module 28, parallel communications 30, and serial communications 32.

Sensor units 20-26 may include any combination of hardware and/or software that provides sensor readings pertaining to the magnetic field that is produced by the magnetic strip located on the ground. According to an exemplary embodiment, each sensor unit 20-26 includes a corresponding sensor array 40-46, a conditioning circuit 50-56, and a conversion circuit 60-66, respectively. Sensor units 20-26 may be evenly distributed or spaced along an edge of sensor board 14 so that they evaluate different parts of the magnetic field produced by the magnetic strip; by doing this, the sensor units may provide sensor system 10 with information about the magnetic field, such as the location of the center of the field, the intensity of the field, the width of the field, etc. Because of their similarity, the following description of sensor unit 20 and its components applies to the other sensor units 22-26 as well.

Sensor array 40 is a collection of one or more sensing elements that work with conditioning and conversion circuits 50, 60 to provide sensor system 10 with sensor readings regarding the detected magnetic field. Sensor array 40 may include any number of different sensor elements, components, devices, modules, etc., but the exemplary embodiment shown here includes eight sensor elements 70-84 in the form of Hall-Effect sensors (e.g., ratiometric linear Hall-Effect sensors) that provide signals that are proportional to the detected strength of the magnetic field, as well as the direction of the magnetic field. Sensor elements 70-84 may directly sense a magnetic field, or they may indirectly determine or calculate the magnetic field from readings taken from other sensor elements, components, devices, modules, subsystems, etc. Skilled artisans will appreciate that a number of different types of sensor elements could be used to detect, sense, monitor or otherwise evaluate the magnetic field in question, and that the present system and method are not limited to the exemplary Hall-Effect sensors shown here. One such example is a photo-diode array. Sensor array 40 may be directly and electronically coupled to its corresponding conditioning circuit 50, indirectly coupled via other electronic components, or coupled according to some other arrangement known in the art. It should also be appreciated that the exemplary sensor arrangement described herein (i.e., eight sensor elements per sensor array, one sensor array per sensor unit, and four sensor units per sensor board for a total of thirty-two sensors) represents only one possible arrangement. Other arrangements with fewer, greater and/or different components are certainly possible.

Figure 5:
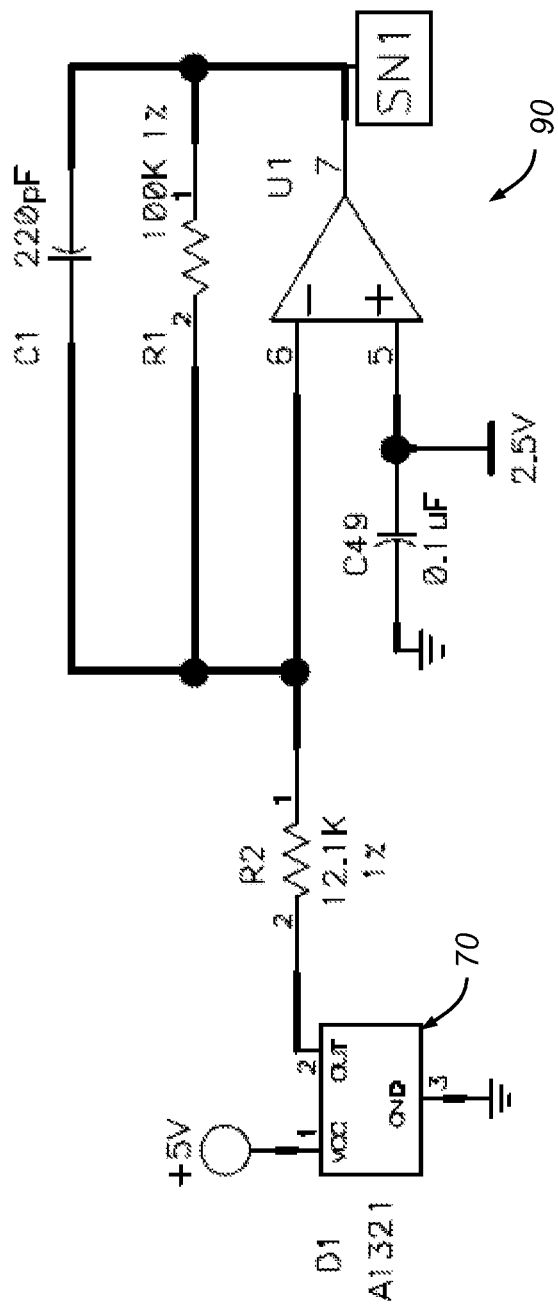
FIG. 5 is a schematic circuit diagram of an exemplary sensor element and conditioning circuit that may be used with the exemplary sensor board of FIG. 2.

Conditioning circuits 50-56 may filter, amplify or otherwise condition the sensor readings from sensor arrays 40-46 before sending them on to conversion circuits 60-66, respectively. In one embodiment, each sensor element 70-84 is coupled to a corresponding filter/amplifier 90-104 so that each sensor reading is filtered and amplified before being sent to conversion circuit 60. Conditioning circuit 50 may employ any type of suitable filtering and amplifying means (e.g., transistor amplifier, operational amplifier, voltage amplifier, etc.). With reference to FIG. 5, there is shown an enlarged view of an exemplary filter/amplifier 90 coupled to a sensor element 70, where the filter/amplifier conditions the sensor readings from the sensor element by filtering and amplifying the signal before passing it along. Even though this exemplary arrangement shows each sensor element 70-84 being electronically coupled to a corresponding filter/amplifier, other arrangements are also possible. For instance, all of the sensor elements 70-84 in sensor array 40 could be coupled to a single filter/amplifier, which in turn could be connected to conversion circuit 60. Skilled artisans will appreciate that the arrangement shown here, where each sensor element has its own filter/amplifier, may provide a fast response that avoids certain bottlenecks. In addition, connecting sensor array 40 to conversion circuit 60 via conditioning circuit 50 provides sensor system 10 with a stackable and modularity feature which can be customized depending on the specific AGV application requirements (e.g., more sensors per array and/or more sensor arrays/sensor unit may be provided if higher precision is required, and so on). As stated earlier, this description applies to sensor arrays 42-46 and conditioning circuits 52-56 as well.

Conversion circuits 60-66 may act as an intermediary between sensor arrays 40-46 and sensor control module 28 by assisting in the conversion and/or communication of sensor readings. According to one exemplary embodiment, conversion circuit 60 acquires sensor readings or signals from conditioning circuit 50, performs an analog-to-digital (A/D) conversion of the signals, multiplexes the signals, and then sends the multiplexed signals out to sensor control module 28 via parallel communications 30. Thus, it is possible for conversion circuit 60 to include any combination of hardware and/or software components capable of filtering, amplifying, buffering, converting, multiplexing and/or otherwise processing the sensor readings. Conversion circuit 60 may have a processing unit and may be a Data Acquisition System (DAS), or part of a DAS, for example. In the exemplary embodiment of FIG. 4, there is shown a conversion circuit 60 having an eight-channel analog-to-digital converter and multiplexer electronically coupled to a corresponding sensor array 40 and conditioning circuit 50 on an input side, and coupled to parallel communications 30 on an output side.

Skilled artisans should appreciate that even though conversion circuits 60-66 are schematically depicted here as separate entities from conditioning circuits 50-56, they may be included or integrated together within the same circuit or system. It is also possible for the filtering, amplifying, buffering, converting, multiplexing and/or signal processing to actually occur at any of the components in sensor units 20-26, as these processes are not specifically limited to any one particular component or circuit. Other modifications and changes to sensor units 20-26 are also possible.

Figure 4:
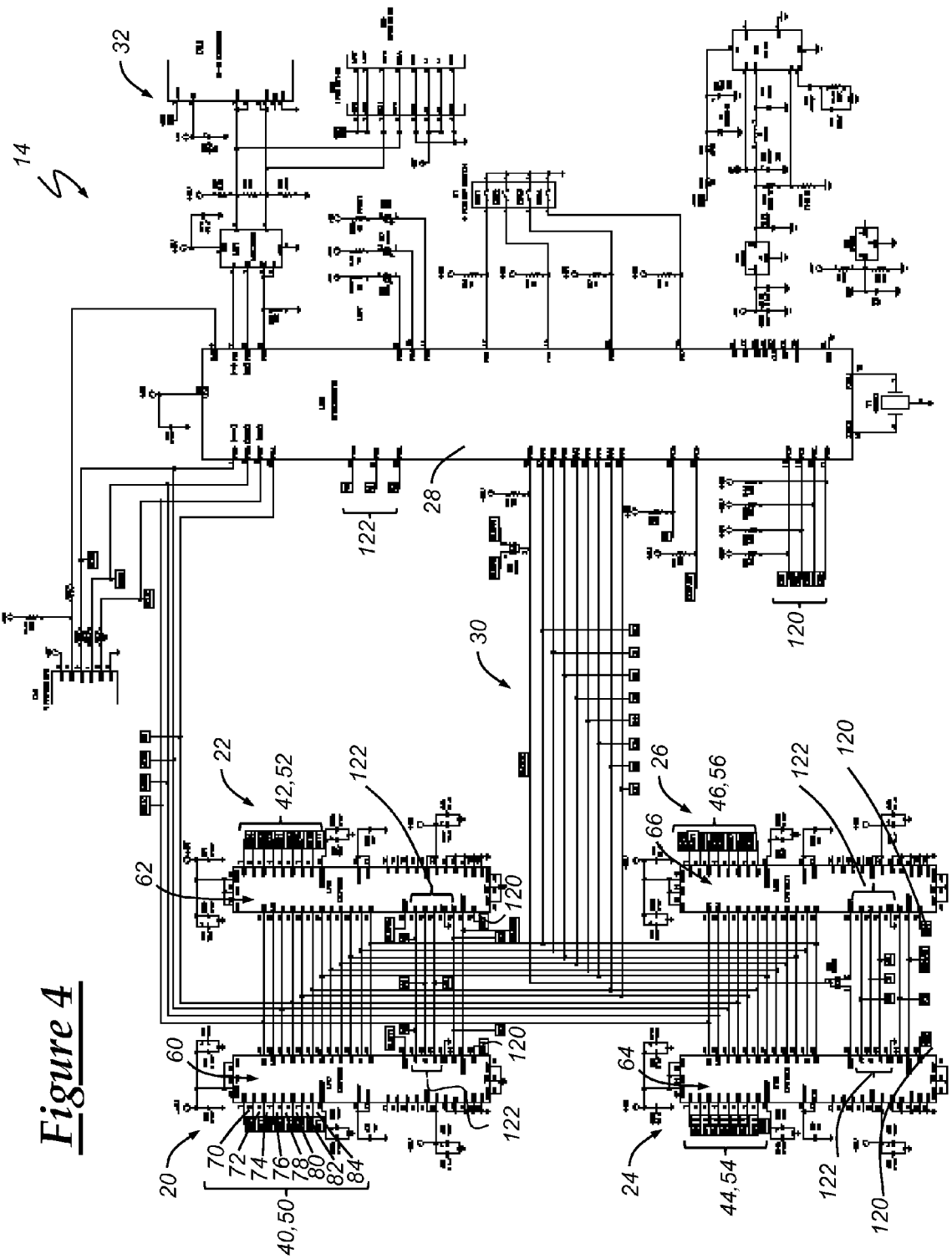
FIG. 4 is a schematic circuit diagram of the exemplary sensor board of FIG. 2.

Sensor control module 28 may include any combination of electronic processing devices, memory devices, communication devices, input/output (I/O) devices, and/or other known components and may perform various processing and/or communication related functions. Even though FIGS. 3 and 4 show sensor control module 28 electronically coupled to four sensor units 20-24, skilled artisans should appreciate that the sensor control module may be connected to more or less sensor units than this. In one embodiment, sensor control module 28 includes a processing device 110 and a memory device 112. Processing device 110 can process information from a number of different sources, including sensor readings from sensor units 20-24, and preferably includes one or more microcontrollers, microprocessors, central processing units (CPUs), application specific integrated circuits (ASICs), or any other suitable processing device known in the art. Processing device 110 may perform a variety of tasks, including executing the method described below which evaluates the sensor readings and provides the output of that evaluation to some other device or system in the AGV. For instance, the AGV's steering system may request information from sensor system 10 regarding the position of the AGV relative to the magnetic strip and, in response to such a request, sensor control module 28 may provide steering system with the requested position information over serial communications 32. This is only one example of the type of task and function that processing device 110 may perform, as it could be used in many other capacities as well.

Memory device 112 may include one or more types of electronic memory (e.g., EEPROM, RAM, flash memory, etc.), and may store different types of information needed for the operation of sensor system 10. For example, the filtered, amplified and digitally converted sensor readings provided by sensor units 20-26 may be stored in memory device 112; the collection of electronic instructions and other data that makes up the present method may be stored in memory device 112; and look-up tables, arrays and other data structures may also be stored in memory device 112, to name a few examples. These are, of course, only some of the items that could be stored at memory device 112, as skilled artisans will know of many other potential uses.

Parallel communications 30 is a parallel connection or bus that may connect the various sensor units 20-24 with sensor control module 28. In this particular embodiment, parallel communications 30 is a single-direction eight-channel bus that conveys information from sensor units 20-24 to sensor control module 28. Sensor control module 28 can request sensor readings from a specific sensor element over chip select lines 120 and address lines 122. In response to this request, the selected sensor element can provide the requested sensor readings back to sensor control module 28 over parallel communications 30. Serial communications 32, on the other hand, is a serial connection that may connect sensor control module 28 with any number of other devices on the AGV, such as a supervisory device 34 like a servo drive of an AGV drive or steering mechanism. In one example, serial communications 32 performs a signal level conversion from a TTL level to an RS485 level. Of course, the serial communications could perform other tasks as well. For communication within sensor system 10, parallel communications 30 may be preferred due to their speed; for communications outside of the sensor system 10, serial communications 32 may be preferred due to their higher resistance to electromagnetic interference (EMI). Of course, other communication arrangements, protocols, etc. are also possible, including wired and wireless communications.

In general operation of sensor system 10, sensor control module 28 may send out a request to one or more sensor elements for sensor readings over chip select/address lines 120, 122. The selected or identified sensor element(s) then takes a sensor reading and passes it to a corresponding filter/amplifier, where the sensor reading is filtered, amplified or otherwise conditioned. The filtered and amplified sensor reading is then provided to a corresponding conversion circuit, which performs additional signal processing steps, such as converting it from analog to digital form. Once the sensor reading has been properly conditioned or packaged for delivery, it may be sent to sensor control module 28 over parallel communications 30 in a multiplexed fashion. At this stage, the sensor readings are processed or otherwise evaluated by processing device 110 according to a method, such as the one described below. The output or results from these evaluations may be stored in memory device 112 and/or transmitted to some other AGV device or system via serial communications 32. Other methods for utilizing or operating sensor system 10 are certainly possible, as the preceding recitation is simply one example.

In one alternative embodiment, two or more sensor boards 14 are aligned and/or connected in a non-parallel fashion; for example, at 90° to one another. By having a first sensor board aligned perpendicular to the magnetic strip on the ground and a second sensor board aligned parallel to the magnetic strip, the AGV may be able to use the sensor system not only for navigating around the path laid out on the ground, but also for parking or docking at different stations along the path, such as an off-line charging station; an activity sometimes referred to as crabbing. In such an arrangement, the perpendicularly aligned sensor board could help navigate during normal forward movement along the path, and the parallel aligned sensor board could help navigate during sideways movement away from the path, such as at a charging or docking station. This is an optional feature and is representative of just one of many potential sensor system arrangements.

Method of Calibration

Figure 6:
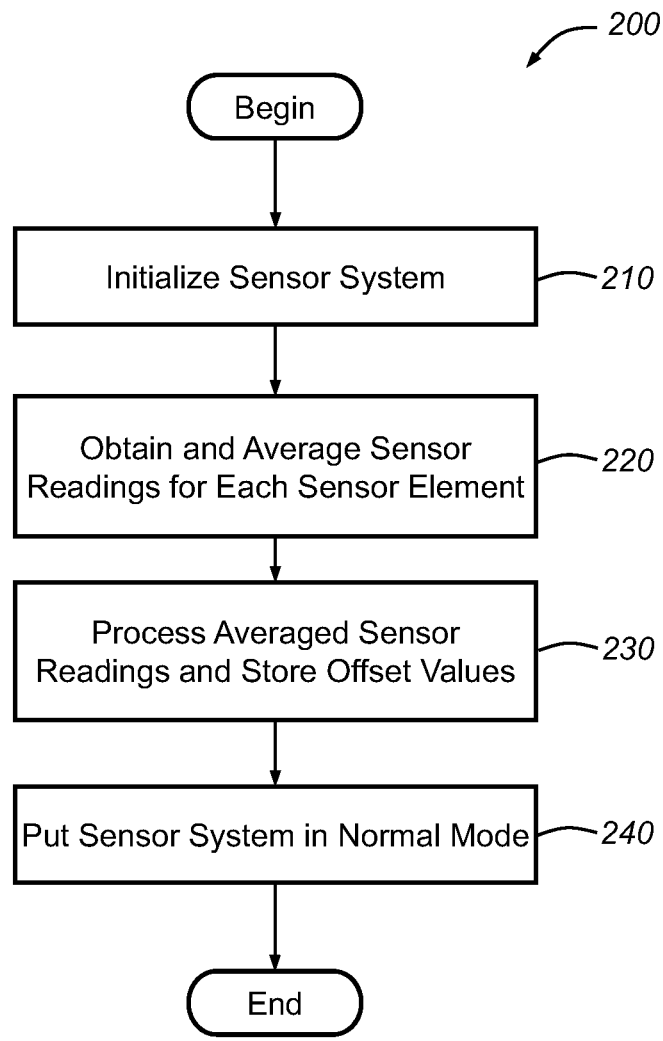
FIG. 6 is a flowchart of an exemplary method that may be used to calibrate a sensor system, such as the exemplary sensor system shown in FIG. 1.

Turning now to FIG. 6, there is shown a method 200 that may be used to calibrate the exemplary sensor system 10. Before operating sensor system 10, it may be desirable to calibrate the system in order to take into account slight discrepancies that may exist between the different sensor units, sensor arrays, sensor elements, conditioning circuits, filters/amplifiers, etc. The electromagnetic interference (EMI) in the surrounding environment can also affect sensor readings. For example, it is possible for sensor elements 70 and 72 to output or generate different sensor readings even when they are exposed to the same magnetic field. Such discrepancies may be due to inherent differences in the components themselves and may be within allowed tolerances. Calibration method 200 is designed to take such discrepancies into account and may include electronic instructions that are stored in memory device 112 and are executed by processing device 110.

The method starts with step 210, which may initialize sensor system 10 by performing one or more initialization or start-up tasks. In one embodiment, step 210 is automatically executed after a power-up sequence of the AGV; in another embodiment, step 210 is executed in response to an initialization or calibration command that is sent to sensor system 10 from some other device on the AGV over serial communications 32. Sensor system 10 is designed such that an external tool or device (e.g., an external computer coupled to the AGV or some supervisory device on the AGV) can initiate a calibration operation simply by sending an appropriate command signal to the sensor system. Skilled artisans should appreciate that other options for initiating the calibration method are also possible. According to one embodiment, step 210 may: initialize a number of ports or connections of sensor system 10 (e.g., parallel communications 30, serial communications 32, chip select lines 120, address lines 122, etc.); enable a watchdog timer within sensor control module 28; initialize global data; and put the sensor system in a raw data mode where sensor readings are provided without adding any type of offset or normalization value. Other initialization or start-up tasks could be performed as well.

Next, step 220 obtains sensor readings from the various sensor elements. In an exemplary embodiment, each sensor element 70-84 of each sensor array 40-46 is instructed to take a certain number of sensor readings (e.g., fifty readings/sensor element) and to provide those sensor readings to sensor control module 28. The sensor readings for each sensor element may then be averaged in order to avoid any anomalies that can occur with a single reading. Once fifty sensor readings are taken for sensor element 70, for example, the calibration method advances to the next sensor element 72 so that fifty new sensor readings may be obtained and averaged. This process may continue until averaged sensor readings have been obtained from all of the sensor elements (e.g., thirty-two averaged sensor readings would be obtained for the thirty-two sensor elements of sensor board 14; one for each sensor element). If the sensor elements are all exposed to the same magnetic field, it follows that the averaged sensor readings should be the same; but this is usually not the case. Calibration method 200 uses the discrepancies between the averaged sensor readings to generate offset values that can calibrate sensor system 10, as is described below. It should be appreciated, however, that the sensor readings do not need to be averaged in this exemplary way, as other techniques are certainly possible. It may be preferable to perform step 220 in an environment that is void of any significant magnetic fields, such as the one produced by the magnetic strip on the ground. This way, the discrepancies in the averaged sensor readings are due to inherent differences in the sensor components and not the nearby magnetic field.

Step 230 processes the averaged sensor readings and stores corresponding offset values. According to one embodiment, processing device 110 uses the averaged sensor readings from the previous step to determine a corresponding offset value for each sensor element, and then stores the offset values in memory device 112. As mentioned above, the sensor elements should theoretically behave the same when exposed to the same magnetic field. But in practice a sensor element may have a slight performance deviation from another due to several reasons including sensor element location, degradation over time, inherent differences in the actual components, electrical noise, etc. Therefore, a separate offset value—which is derived from the previously gathered averaged sensor readings—is determined for each sensor element and is stored in sensor system 10. For example, if the averaged sensor readings from sensor element 70 are 0.1 V higher than they should be, then step 230 may generate and store an offset value of −0.1 V for this sensor element. When sensor element 70 is subsequently used in a normal mode, its sensor readings will be adjusted by −0.1 V in order to compensate for its internal bias and provide a more accurate reading. This calibration method enables one or more sensor elements (e.g., an entire sensor array) to be easily calibrated on the fly if new hardware is installed, versus manually calibrating the new hardware by making physical adjustments to components such as potentiometers and the like. Furthermore, it is possible to calibrate a sensor board that is or is not mounted to an AGV. Other benefits will become obvious to skilled artisans as well.

Step 240 puts sensor system 10 back in a normal mode. Now that calibration of sensor system 10 is complete, step 240 may cause the sensor system to exit the calibration mode by changing a setting from "calibration mode" or "raw data mode," as described above, to a "normal mode" where sensor readings are compensated with offset values. In normal mode operation, sensor system 10 may provide sensor readings to other devices and systems around the AGV, where the sensor readings have been adjusted or compensated to take into account the small discrepancies that sometimes exist between sensor elements. Such a process is sometimes referred to as "normalization." Other steps may also be taken to ready sensor system 10 for normal mode operation.

Method of Operation

Figure 7:
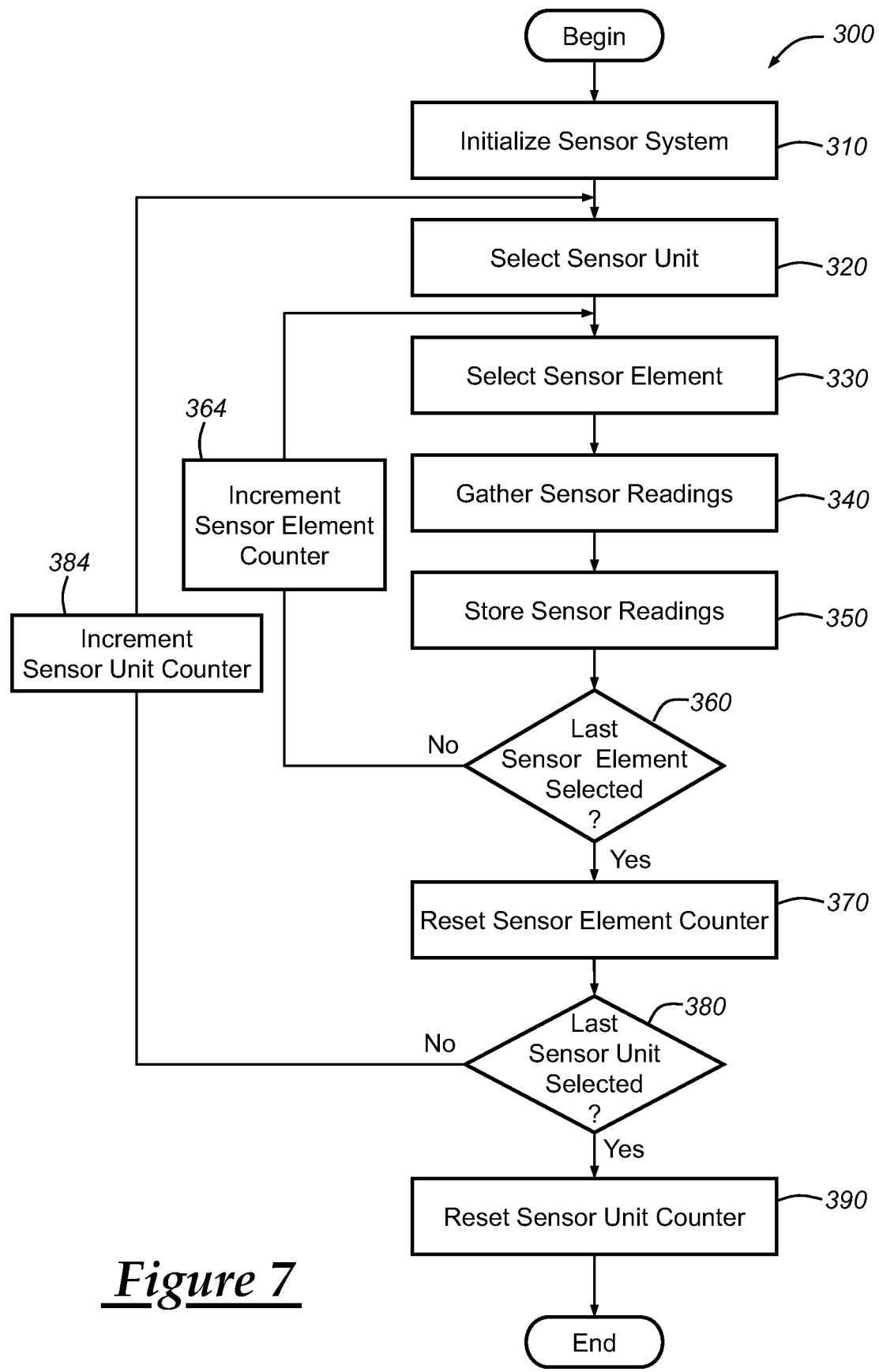
FIG. 7 is a flowchart of an exemplary method that may be used to operate or control a sensor system, such as the exemplary sensor system shown in FIG. 1.

Turning now to FIG. 7, there is shown an exemplary method 300 for operating or controlling a sensor system, such as sensor system 10. In some applications, method 300 may continuously run and collect sensor readings so long as sensor system 10 is activated or turned 'on'. Such a method constantly updates the sensor readings so that if a request for sensor readings is received (e.g., an interrupt signal received from some other device in the AGV over serial communication 32), then sensor system 10 can provide the requesting device with a recent and current set of sensor readings. In an exemplary embodiment, method 300 is executed or cycles on a periodic basis that takes several microseconds per sensor element. Other bases for performing or executing method 300 are certainly possible.

Beginning with step 310, the method may initialize sensor system 10 by performing one or more initialization or start-up tasks. According to an exemplary embodiment, step 310 may: initialize a number of ports or connections of sensor system 10 (e.g., parallel communications 30, serial communications 32, chip select lines 120, address lines 122, etc.); enable a watchdog timer within sensor control module 28; initialize global data; and put the sensor system in a normal operation mode where sensor readings are provided with an offset or normalization value built into the readings, as previously described. Other initialization or start-up tasks could be performed as well.

Next, steps 320-390 may be used by method 300 to cycle through all of the sensor elements (thirty-two sensor elements in the exemplary sensor board 14) and collect sensor readings or other data from each one. As mentioned above, it is possible for sensor system 10 to include multiple sensor boards 14 connected together in an end-to-end fashion; e.g., up to eight sensor boards may be connected end-to-end. The following description is directed to a single sensor board embodiment, however, the process of cycling or looping through all of the sensor elements applies to multiple board embodiments as well. Furthermore, it is not necessary that method 300 begin collecting sensor readings from any one sensor element, or that the sensor elements be selected in any particular order, as the following data acquisition method is simply one possible embodiment.

Step 320 selects the sensor unit from which sensor readings are to be taken. For example, sensor control unit 28 may select sensor unit 20 through the use of chip select lines 120 so that the method can begin collecting sensor readings from the various sensor elements in sensor array 40. Next, step 330 selects the individual sensor element from which sensor readings are to be taken. This selection can also be made by sensor control module 28, for example, which may put the address of the selected sensor element on address lines 122 (e.g., the address for sensor element 70). With the selections made in steps 320 and 330, an individual sensor unit has been identified for retrieval of sensor readings. Other methods for selecting and cycling through the various sensor elements may also be used.

Step 340 gathers sensor readings or other data from the selected sensor element. Continuing with the preceding example, if sensor element 70 is selected then it provides an analog sensor reading to amplifier/filter 90, which amplifies and filters the reading before passing it onto conversion circuit 60. The conversion circuit, in turn, can convert the analog reading into digital form and then send the amplified, filtered and digitized sensor reading to sensor control module 28 over parallel communications 30. In one embodiment, sensor element 70 provides a voltage output that is related to the strength and/or direction of the magnetic field that it senses; but other techniques for representing the detected magnetic field may be used instead. Once the sensor readings are received at control module 28, step 350 may store the sensor readings for the selected sensor element at memory device 112 or some other suitable location.

Step 360 determines if the last sensor element of that particular sensor unit has been selected. If the last sensor element has not been selected, then step 364 increments a sensor element counter and the method loops back to step 330 so that sensor readings may be gathered from the next sensor element. If the last sensor element has been selected, then the method proceeds to the next step. Continuing with the preceding example, if sensor element 70 was selected, then step 360 will recognize that this sensor element is not the last element of sensor unit 20 and that other sensor elements still need to be queried. Step 364 will increment the sensor element counter from sensor element 70 to sensor element 72 and the process will be repeated. This looping sequence continues until step 364 encounters sensor element 84, which is the last sensor element of sensor unit 20. At which point, the sensor element counter is reset (step 370) and the method proceeds to step 380, which checks to see if the last sensor unit has been selected. In the example above, sensor unit 20 does not represent the last sensor unit (sensor units 22-26 still need to be queried), so step 380 passes the method along to step 384 which increments a sensor unit counter to point at sensor unit 22. Sensor readings may then be gathered and stored from the various sensor elements of sensor array 42 (which is part of sensor unit 22), as described above. This process continues until sensor readings have been gathered from all of the sensor elements of all of the sensor units (thirty-two in the present example), at which point the sensor unit counter is reset in step 390 and the method generally ends until it is time for method 300 to cycle again.

Skilled artisans will appreciate that other embodiments and techniques for selecting sensor elements are certainly possible. For example, it is possible for sensor elements to be randomly selected in any order instead of being selected in a chronological order, as described above. It is also possible to gather sensor readings from every other sensor element or to use some other partial data gathering method in order to increase the speed of data acquisition and/or to reduce the amount of memory required. It was mentioned above that multiple sensor boards 14 may be connected end-to-end so that the overall sweep or length of the system is increased. Method 300 may be adapted for such a system by including an additional loop sequence that checks to see if the last sensor board has been selected and if it has not, then increment a sensor board counter and advance to the next sensor board. If the last sensor board has been selected, then the method may end the operation. Such a compounded loop sequence could continue until all of the sensor elements of all of the sensor units, and all of the sensor units of all of the sensor boards have been selected.

Figure 8:
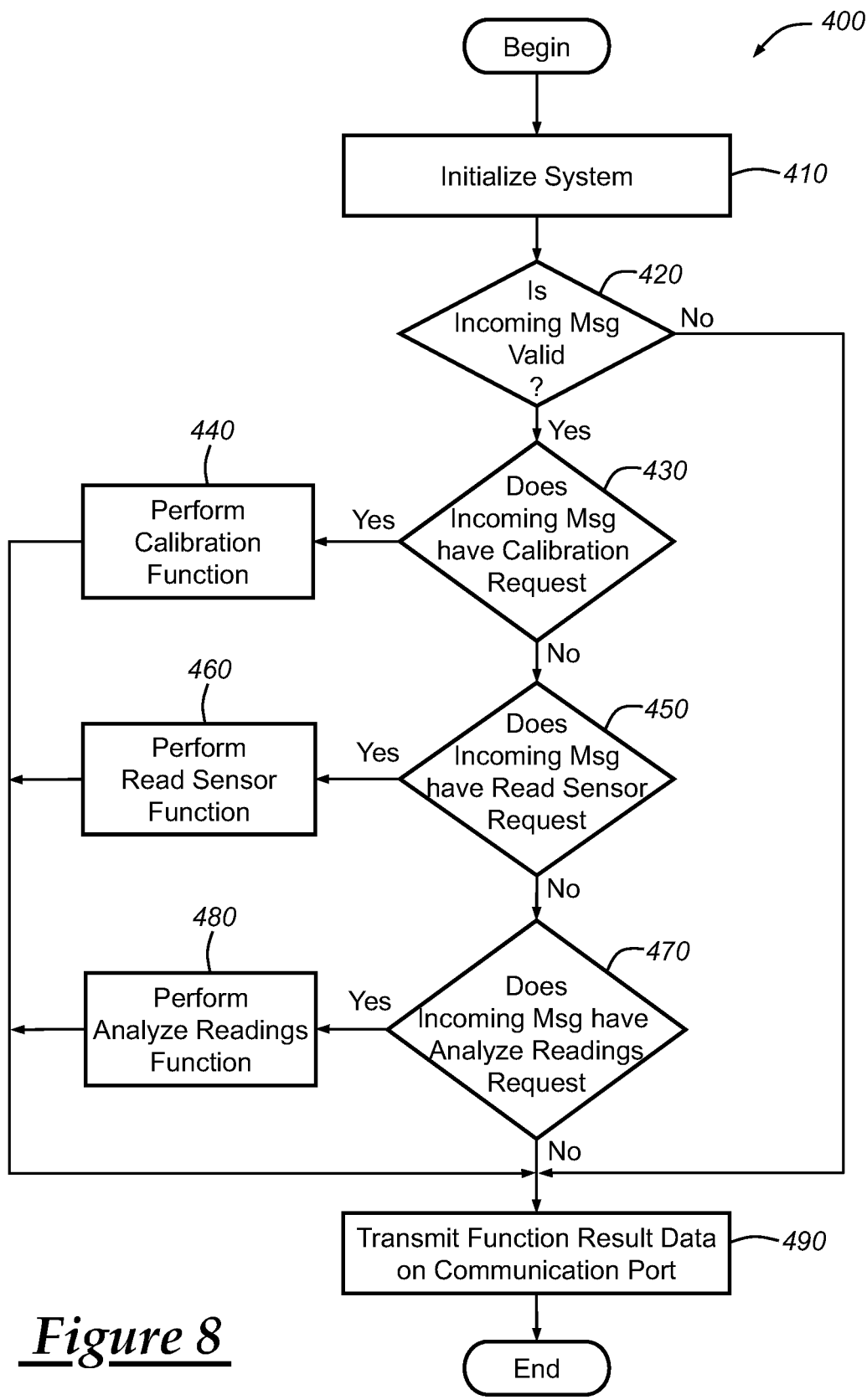
FIG. 8 is a flowchart of another exemplary method that may be used to operate or control a sensor system, such as the exemplary sensor system shown in FIG. 1.

Turning now to FIG. 8, there is shown an exemplary method 400 that may be used by a device or system in the AGV to gather sensor readings from sensor system 10. For example, if a drive system in the AGV required information regarding the position and/or alignment of the AGV, then that system could use method 400 to acquire such information from sensor system 10. Sensor system 10 may operate according to two main execution paths: a first path is method 300, which is periodically gathering sensor readings and is continuously running whenever the sensor system is "on;" a second path is method 400, which provides sensor readings from sensor system 10 to some other device or system and is executed on an interrupt basis (e.g., it can be executed whenever serial communications 32 receives data).

According to an exemplary embodiment, processing device 110 executes method 300 such that it continuously gathers and updates sensor readings from the various sensor elements, as already described. This continuous and periodic process carries on until serial communications 32 receives an incoming message, at which point the processing device ceases execution of method 300 and begins executing method 400 in order to determine the nature of the incoming message. Once method 400 is performed, processing device 110 resumes executing method 300 until another message is received at the serial communications 32. Skilled artisans will appreciate that the "interrupt-style" interaction between methods 300 and 400 just described is only one possible arrangement, as methods 300 and 400 are not limited to this and may be activated or executed according to other arrangements as well. For instance, method 400 could be executed on a periodic basis, as opposed to an interrupt basis.

Beginning with step 410, the method may initialize sensor system 10 by performing one or more initialization or start-up tasks. According to an exemplary embodiment, step 410 may: initialize a number of ports or connections of sensor system 10 (e.g., parallel communications 30, serial communications 32, chip select lines 120, address lines 122, etc.); clear or set buffers, variables, etc.; and set a message watchdog timer within sensor control module 28. The message watchdog timer may be used to monitor the period or time lapse between bytes of the incoming message, in order to ensure that the incoming message on serial communications 32 is intact. Other initialization or start-up tasks could be performed as well.

Step 420 determines if the incoming message is valid, and may use a number of different techniques for doing so. One or more checks may be performed to determine the validity of the incoming message, including checking the message's structure integrity (i.e., syntax) and/or its content logic (i.e., semantic). In one embodiment, step 420 determines the syntax validity of the incoming message by validating, for example, its checksum or message length. This validation process may include using a parity byte or word, modular sum, position dependent checksum (e.g., Fletcher's checksum, Adler-32, cyclic redundancy checks (CRCs)), or any other suitable technique for checking syntax. Step 420 may also check the validity of the semantics of the incoming message. This may include, for example, checking to make sure that any sensor element numbers are valid, board numbers are valid, etc. If the request is invalid—such as the case of a corrupted or erroneous incoming signal—then method 400 ends at this step; otherwise, method 400 proceeds to the next step. It should be appreciated that while exemplary method 400 is shown having three function calls or sub-routines (440, 460, 480), the method is not limited to this and is flexible such that function calls or sub-routines can easily be added or removed. For instance, additional function calls could be included for controlling LEDs or other visual indicators on the AGV, for retrieving or modifying configuration settings, or for any function that is appropriate for sensor system 10 to perform.

Step 430 evaluates the contents of the incoming message and determines if there is a request to calibrate sensor system 10. One instance when such a request is likely to be used is if one or more pieces of hardware in sensor system 10 have recently been replaced but have not yet been calibrated. If step 430 determines that the incoming message does in fact contain a calibration request, then step 440 performs the requested calibration. The calibration may be for an entire sensor system 10 (all thirty-two sensor elements), a particular sensor unit (eight sensor elements), or one or more individual sensor elements, depending on the contents of the incoming message. Step 430 may perform or execute the calibration method 200 that was previously described In another embodiment, step 430 may simply inquire as to the calibration status or offset value of one or more sensor elements; this information may then be transmitted back to the requesting device over serial communications 32. If step 430 determines that the incoming message does not contain a calibration request, then method 400 proceeds to the next step.

Step 450 evaluates the contents of the incoming message and determines if there is a request to read one or more sensor elements. For example, a supervisory device in the AGV (e.g., a servo drive) may require sensor readings from one or more sensor elements in order to operate properly. In such a case, the incoming message that the device sends to sensor system 10 over serial communications 32 may include a request to read out certain sensor elements. Such requests may specify a single sensor element (e.g., sensor board 14, sensor unit 20, and sensor element 78), or they may specify a range or group of sensor elements. If step 450 determines that there is a read sensor request, then step 460 may retrieve the requested sensor reading(s) from memory device 112, package the sensor reading(s) into a suitable message format, and send the packaged sensor reading(s) to the requesting device over serial communications 32. The use of specific address locations in memory device 112 tied to specific sensor elements may be used during step 460. It should be appreciated that the read sensor request may further contain additional data, information, settings, etc. that affect the request. For example, the read sensor request may indicate whether the sensor readings are to be provided in a normalized state (i.e., with offset values built in) or in a raw data state where no offset compensation has been applied. Other settings and parameters are also possible. If step 450 determines that there is no read sensor request within the incoming message, then method 400 proceeds to the next step.

Step 470 evaluates the contents of the incoming message and determines if there is a request to analyze the sensor readings. Such a request may include any solicitation for analyzing, evaluating and/or performing various calculations on the sensor readings, and any number of different techniques may be used. For instance, a supervisory device on the AGV may want to know the current position of sensor system 10 (and hence, the position of the AGV) relative to the magnetic field that is generated by the magnetic strip laid out on the floor. A number of different methods and techniques may be employed in order to determine this position, including the exemplary "center of field" analysis described below. Other requests for analyzing sensor readings may include requests for determining: magnetic field presence or absence, magnetic field width, minimum and maximum magnetic field strengths or direction, the number of maxima or minima field strengths of a magnetic field, the presence of docking or charging stations, or the presence of "work zones" or any other specific locations or location markers along the guided path where the AGV is expected to perform some specific function. Other requests are certainly possible. The request for analysis may include one or more parameters to be used during the analysis or evaluation (e.g., identification of sensor board that is to be used, left- or right-hand sensor sweep direction, north or south magnetic field polarity, minimum threshold or noise value, minimum width threshold, etc.).

If step 470 determines that there is a request to analyze sensor readings, then step 480 is performed; if step 470 determines that there is no request to analyze sensor readings in the incoming message, then the method proceeds to step 490 where output from method 400 can be sent to some other device within the AGV (e.g., the device that sent the incoming message to begin with). Although step 490 may transmit output via any type of communication port, serial communications 32 may be particularly well suited for this. In one embodiment, the output or response may include a confirmation that a request has been fulfilled successfully or unsuccessfully; for instance, if a calibration request has been requested then upon successful calibration of sensor system 10, a confirmation message could be sent indicating as much. In other instances specific data may be requested. For example, if a specific sensor element offset value is requested then this value would be transmitted in the output or response message. Skilled artisans should appreciate that the particular order or combination of steps in method 400 is not limited to the exemplary embodiment shown and described here, as other combinations and sequences may be used instead.

Figure 9:
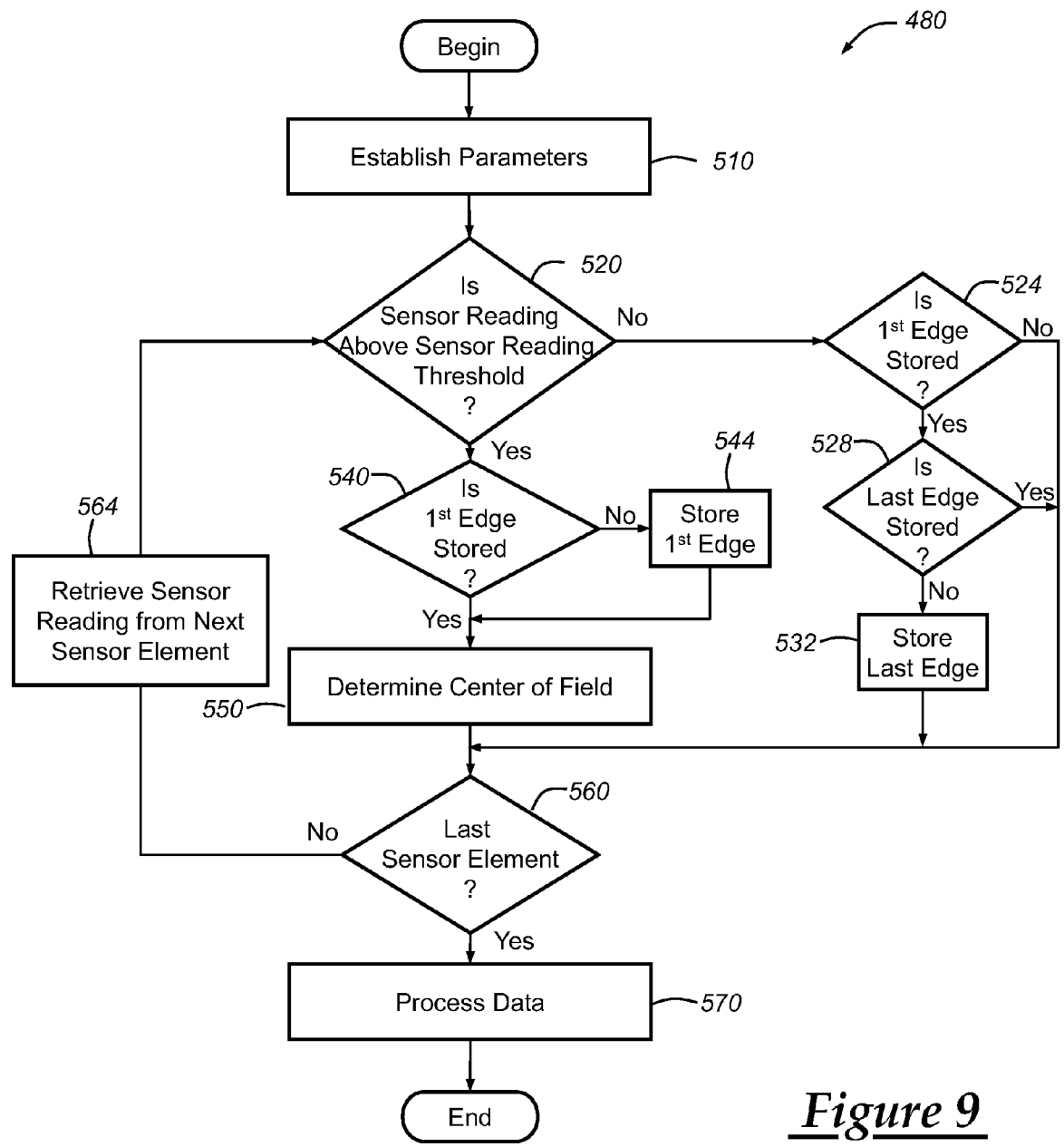
FIG. 9 is a flowchart of an exemplary method that may be used to determine the location, position, orientation, etc. of a sensor system, such as the exemplary sensor system shown in FIG. 1, relative to a magnetic field.
Figure 10:
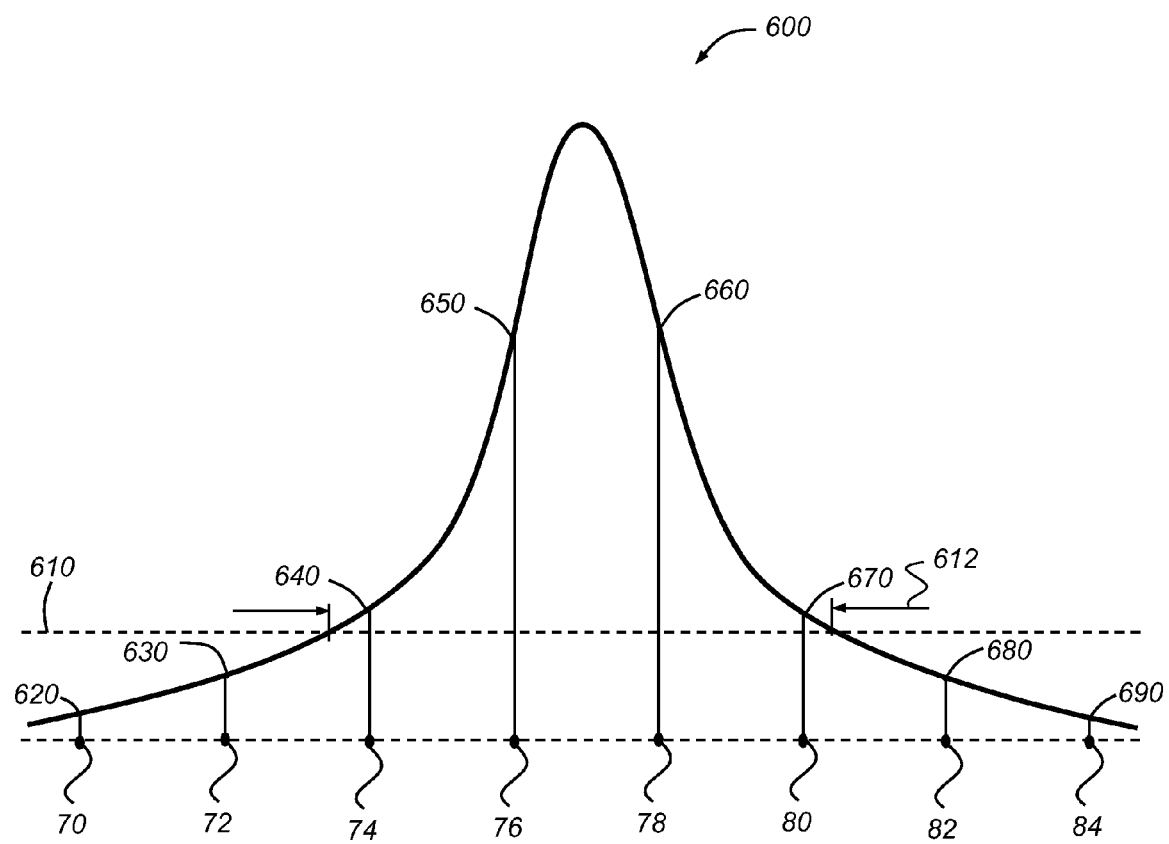
FIG. 10 is a graphic representation of some exemplary sensor readings and is provided in conjunction with the exemplary method shown in FIG. 9.

An exemplary step 480 is described in more detail in conjunction with FIGS. 9 and 10. In this particular embodiment, step 480 performs a "center of field" analysis of the most recent sensor readings in order to determine the center or centroid of the magnetic field. Other output, like field width and maximum field strength, may also be generated during this step. Beginning with step 510, the method initializes or establishes one or more parameters that may be needed for the analysis. According to an exemplary embodiment, step 510 establishes the following parameters: a sensor board number (e.g., 0-7) if multiple sensor boards are being used; a minimum sensor reading threshold (typically the threshold is set just above the noise floor so that noisy sensor readings can be discarded); a sensor sweep direction (e.g., from a leftmost sensor element to a rightmost sensor element, or vice versa) that dictates the direction of polling across the linear sensor array; an expected field polarity (e.g., north, south, etc.) of the magnetic field; as well as any other suitable parameter used for sensor reading analyses. Any of the parameters established in step 510, including the minimum sensor reading threshold, may be static (e.g., determined during manufacture, determined during system installation, etc.) or dynamic (e.g., modified daily, modified every work shift, etc.). For example, a supervisory device could send a message to sensor system 10 over serial communications 32 instructing it to increase its minimum sensor reading threshold from a first level to a second level, or to decrease the threshold by 10%. This adjustability feature may be particularly useful in environments where the electromagnetic interference (EMI) is variable or where the magnetically sensed material varies. Clipping or adjusting the minimum sensor reading threshold up or down may cause "regions of interest" to emerge, as will be explained in more detail. Step 510 may also perform other setup tasks including clearing buffers and counters, initializing variables, etc.

Next, step 520 determines if a sensor reading is above the minimum sensor reading threshold. As suggested above, the sensor reading threshold may be set slightly above the minimum noise level that sensor readings should be at in order to be taken into consideration. FIG. 10 shows a graphical representation of an exemplary magnetic field 600, where various sensor elements (70-84) are represented on the X-axis and sensor readings (620-690) in terms of magnitude or intensity of detected magnetic field are represented on the Y-axis. Dashed line 610 represents a minimum sensor reading threshold. Sensor element 70, which may be the leftmost sensor element in this particular example, generates sensor reading 620, which is below sensor reading threshold 610; thus, step 520 sends control of the method to step 524 to see if a first edge has already been stored. "Edges," as used herein, generally describe the edge of the magnetic field; that is, the points along the curve in FIG. 10 where the detected magnetic field strength or sensor reading crosses over some sensor reading threshold (around points 640, 670 in this exemplary graph). The "first edge" corresponds with the first sensor reading that crosses over sensor reading threshold 610 and generally represents the beginning of the magnetic field, and the "last edge" corresponds with the last sensor reading that was above the sensor reading threshold and generally represents the end of the magnetic field. The reason that step 524 checks to see if a first edge has been stored is to determine if the current sensor reading is before the beginning of the magnetic field (sensor readings 620, 630) or is beyond the end of the magnetic field (sensor readings 680, 690). Since a first edge has not yet been stored in this example (no sensor reading has yet to exceed threshold 610 in this particular left-to-right sweep of the sensor elements) and sensor element 70 is not the last sensor element to be polled, the method ignores sensor reading 620 and step 560 passes control to step 564.

Step 564 retrieves a sensor reading from the next sensor element, which in this example is sensor reading 630 from sensor element 72. Sensor reading 630 is still below minimum sensor reading threshold 610. Therefore, the method again answers no to steps 520, 524 and 560 and proceeds to retrieve or gather a third sensor reading 640 in step 564. Only this time sensor reading 640 is above sensor reading threshold 610, so that the method proceeds to step 540 which determines if a first edge is stored. The answer is "no" because this is the first time that a sensor reading has exceeded the threshold, and sensor reading 640 is stored as the first edge, step 544. In one embodiment, step 544 stores the value associated with sensor reading 640 and/or the identification of sensor element 74 in memory device 112, but other embodiments are possible. The method proceeds to step 550 where a center of field analysis may be performed to determine the center or centroid of the magnetic field, as will be explained below. In the case of sensor readings 650, 660 and 670, the readings are above threshold 610 (step 520), a first edge has already been stored (step 540), and the last sensor element has not yet been reached or polled. Therefore, the method continues to perform a center of field analysis or calculation in step 550 (this can be a reiterative calculation). When step 520 compares sensor reading 680 with threshold 610 and determines that the reading is below the threshold, it will send the method to step 524 which will determine that a first edge has already been stored. Step 528 will then determine if a last edge has been stored (in this case the last edge is simply a second edge). And since a last edge has not been stored, step 532 will store one (again, this could be stored in memory device 112). Because sensor readings 680 and 690 are below minimum sensor reading threshold 610, they are not included in the center of field calculation.

When step 560 encounters sensor reading 690, it will determine that this reading corresponds with sensor element 84 which is the last or rightmost sensor in this particular example. The method may be set up so that the last sensor element in a particular sensor array constitutes the "last sensor element," or it could be set up so that the last sensor element in a particular sensor board constitutes the "last sensor array," to cite several examples. It is even possible for the first and last sensor elements to span several different sensor boards, as they are not limited to a single board. Now that the last sensor element is reached, the method proceeds to step 570 so that one or more calculations, analyses, evaluations, etc. may be performed. As mentioned above, method 680 may conduct any number of different analyses, and is not limited to the center of field analysis mentioned above. For instance, step 570 may determine if a magnetic field is present (because multiple sensor readings exceeded threshold 610, a magnetic field is likely present). Step 570 could determine a magnetic field width, which in this case is represented by distance 612. Magnetic field width may be provided in one of a variety of units, including numbers of sensor elements (three sensor units wide in the present example). Step 570 can provide a maximum magnetic field strength, which in this case may be the magnitude or Y-axis value of sensor reading 660. Extrapolation techniques may even be used to try and derive the maximum magnetic field strength value that lies between sensor readings 650 and 660. Other analyses, determinations and output may be generated at step 550.

Returning to step 550, there is provided a brief explanation of an exemplary "center of field" calculation that may be used to determine the center or centroid of the magnetic field that is produced by the magnetic strip on the ground that the AGV is following. The center of the magnetic field (CG), also referred to as the center of magnetic influence or center of gravity, may be determined by using Equation 1:

$$CG := \frac{\sum_{n=1}^{N} m_n r_{G_n}}{\sum_{n=1}^{N} m_n} \quad \text{(Equation 1)}$$

In the above Equation 1, (CG) is the center of field value or the center of the magnetic field, ($m_n$) is a sensor reading for sensor element (n), ($r_{G_n}$) is a lateral distance from a fixed point on the AGV (e.g., the center of sensor board 14 or the center of the AGV) for sensor element (n), and (N) is the number of sensor elements included in the calculation (N would be 32 or less in the example described above). Summing the products of each sensor element location and the value of the corresponding sensor reading (i.e., the numerator), and then dividing by the sum of all the sensor reading values (denominator) may result in an ideal location or center location of highest field strength. This efficient approach weights the locations of the different sensor elements with the magnitude of their sensor readings, and is different from curve fitting approaches which may require much more processing resources and take more time to calculate.

In certain applications, the minimum sensor reading threshold 610 may be adjusted up or down and may allow other "regions of interest" to emerge. Equation 1 may be used as part of a method that can determine CG for all sensor readings, or for a subset of sensor readings corresponding to specific regions of interest. In one example, where the magnetic strip or tape laid out on the ground along the pre-determined path is limited to a single polarity (all facing north, south, etc.), individual or separate pieces of magnetic tape having the opposite polarity may be used as location markers. For example, if the main path around a factory floor is determined by a magnetic strip or tape that generates a north facing magnetic field, small sections of south facing tape can be used to identify the positions of docking or charging stations, or the like. Other techniques may also be used in lieu of or in addition to the center of field analysis provided above. It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance" and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method for operating a sensor system for an automated guide vehicle (AGV), comprising the steps of:
    (a) providing a sensor system having a plurality of magnetic sensor elements that interact with a magnetic indicating system that is laid out on the ground and follows a pre-determined path;
    (b) obtaining sensor readings for each of the magnetic sensor elements;
    (c) storing the sensor readings for each of the magnetic sensor elements at a memory device; and
    (d) using a known location of each of at least some of the magnetic sensor elements on the sensor system along with the stored sensor readings associated with the at least some of the magnetic sensor elements to determine a center of field value that represents the center or centroid of a corresponding magnetic field produced by the magnetic indicating system, wherein, for each of the at least some magnetic sensor elements, the known location of the sensor elements is weighted with the magnitude of the associated stored sensor reading.

2. The method of claim 1, wherein step (d) further comprises using the stored sensor readings and the following equation to determine the center of field value:

$$CG := \frac{\sum_{n=1}^{N} m_n r_{G_n}}{\sum_{n=1}^{N} m_n},$$

where:
    (CG) is the center of field value;
    ($m_n$) is a sensor reading for sensor element (n);
    ($r_{G_n}$) is a lateral distance from a fixed point on the AGV for sensor element (n); and
    (N) is the number of sensor elements included in the calculation.

3. The method of claim 2, wherein the center of field value equation only uses sensor readings (mn) that are greater than a threshold value so that the number of sensor elements included in the calculation (N) is less than the total number of sensor elements of the sensor system.

4. The method of claim 1, wherein steps (b)-(d) are part of a periodic process, and the method further comprises the steps of:

interrupting the periodic process to perform one or more of the following functions: a calibration function, a read sensor function, or an analyze readings function; and
resuming the periodic process following completion of the one or more functions.

5. The method of claim 4, wherein the step of interrupting the periodic process includes performing the analyze readings function, and the analyze readings function includes one or more of the following: determining the presence or absence of a magnetic field, determining the width of a magnetic field, determining minimum and/or maximum strengths of a magnetic field, determining the direction of a magnetic field, determining the presence or absence of a location marker, or determining the number of maxima and/or minima strengths of a magnetic field.

6. The method of claim 4, wherein the step of interrupting the periodic process includes performing the read sensor function, and the read sensor function uses one or more of the following: identification of a sensor board; identification of a sensor sweep direction; identification of a magnetic field polarity; identification of a sensor reading threshold value; or identification of a minimum magnetic field width threshold value.

7. The method of claim 1, further comprising the step of:
establishing a sensor reading threshold value, wherein only sensor readings that are above the threshold value are used in the center of field value equation.

8. The method of claim 7, further comprising the steps of:
providing the sensor system so that the sensor elements are spaced along at least a portion of the lateral width of the AGV from a leftmost sensor element to a rightmost sensor element; and
consecutively obtaining sensor readings for each of the sensor elements in a sensor sweep direction that is either from the leftmost sensor element to the rightmost sensor element or from the rightmost sensor element to the leftmost sensor element.

9. The method of claim 8, further comprising the steps of:
defining a first edge of the corresponding magnetic field at the location of the first sensor element in the sensor sweep direction that has a sensor reading above the sensor reading threshold value; and
defining a last edge of the corresponding magnetic field at the location of the last sensor element in the sensor sweep direction that has a sensor reading above the sensor reading threshold value.

10. A method for operating a sensor system for an automated guide vehicle (AGV), comprising the steps of:
(a) providing a sensor system having an array of magnetic sensor elements that interact with a magnetic indicating system that is laid out on the ground and follows a pre-determined path;
(b) obtaining sensor readings for the magnetic sensor elements;
(c) storing the sensor readings for the magnetic sensor elements at a memory device; and
(d) calculating a center of field value that represents the center or centroid of a corresponding magnetic field by:
determining a first edge of the magnetic field during the sensor reading sweep of step (b), wherein the first edge is associated with the sensor element that first exceeds a predetermined threshold, and
then determining a second edge of the magnetic field during the sensor reading sweep of step (b), wherein the second edge is associated with the sensor element that last exceeds the predetermined threshold,
wherein the calculation of the center of field includes a weighting calculation of a range of the sensor elements, wherein the weighting calculation uses a known location on the sensor system, the sensor readings for each of the range of sensor elements, and known locations for each of the range of sensor elements,
wherein the range includes the sensor element firstly exceeding the predetermined threshold, the sensor element lastly exceeding the predetermined threshold, and all the sensors elements therebetween.

11. The method of claim 10, wherein step (b) further comprises either sweeping the array from a leftmost sensor element to a rightmost sensor element or sweeping the array from the rightmost sensor element to the leftmost sensor element.

12. The method of claim 10, wherein the calculating step (d) further comprises using the following equation to determine the center of field value:

$$CG = \frac{\sum_{n=1}^{N} m_n * r_{Gn}}{\sum_{n=1}^{N} m_n}$$

where:
(CG) is the center of field value;
($m_n$) is a sensor reading for sensor element (n);
($r_{Gn}$) is a lateral distance from a fixed point on the AGV for sensor element (n); and
(N) is the number of sensor elements included in the calculation.

13. The method of claim 12, wherein the calculating step (d) uses less than the total number of sensor elements of the sensor system.

14. The method of claim 10, wherein steps (b)-(d) are part of a periodic process, and the method further comprises the steps of:
interrupting the periodic process to perform one or more of the following functions: a calibration function, a read sensor function, or an analyze readings function; and
resuming the periodic process following completion of the one or more functions.

15. The method of claim 14, wherein the step of interrupting the periodic process includes performing the analyze readings function, and the analyze readings function includes one or more of the following: determining the presence or absence of a magnetic field, determining the width of a magnetic field, determining minimum and/or maximum strengths of a magnetic field, determining the direction of a magnetic field, determining the presence or absence of a location marker, or determining the number of maxima and/or minima strengths of a magnetic field.

16. The method of claim 14, wherein the step of interrupting the periodic process includes performing the read sensor function, and the read sensor function uses one or more of the following: identification of a sensor board; identification of a sensor sweep direction; identification of a magnetic field polarity; identification of a sensor reading threshold value; or identification of a minimum magnetic field width threshold value.

17. The method of claim 10, wherein the predetermined threshold is statically or dynamically configurable.

18. The method of claim 10, wherein step (a) further comprises providing the sensor system so that the sensor elements are spaced along at least a portion of the lateral width of the AGV from a leftmost sensor element to a rightmost sensor element.

* * * * *